United States Patent
Toth (10) Patent No.: US 9,012,099 B2
(45) Date of Patent: Apr. 21, 2015

(54) MEASURING SYSTEM FOR CELLS IN A FUEL CELL STACK

(75) Inventor: Antoine Toth, Delémont (CH)

(73) Assignee: Belenos Clean Power Holding AG, Bienne (CH)

( * ) Notice: Subject to any disclaimer, the term of this patent is extended or adjusted under 35 U.S.C. 154(b) by 342 days.

(21) Appl. No.: 13/303,760

(22) Filed: Nov. 23, 2011

(65) Prior Publication Data

US 2012/0135279 A1    May 31, 2012

(30) Foreign Application Priority Data

Nov. 25, 2010   (EP) .................................... 10192609

(51) Int. Cl.
| | |
|---|---|
| *H01M 8/06* | (2006.01) |
| *H02J 7/00* | (2006.01) |
| *H01M 8/04* | (2006.01) |
| *G01R 31/36* | (2006.01) |

(52) U.S. Cl.
CPC ......... *H02J 7/0021* (2013.01); *H01M 8/04865* (2013.01); *H01M 8/04992* (2013.01); *H01M 8/04544* (2013.01); *G01R 31/3658* (2013.01)

(58) Field of Classification Search
CPC ............. G01R 31/3658; H02J 7/0021; H01M 8/04544; H01M 8/04865; H01M 8/04992; H01M 2010/4271
USPC ........ 429/427–432, 61, 90, 92, 461, 490, 492
See application file for complete search history.

(56) References Cited

U.S. PATENT DOCUMENTS

| | | | |
|---|---|---|---|
| 6,472,880 B1 | 10/2002 | Kang | |
| 7,755,326 B1 | 7/2010 | Thivierge | |
| 2007/0285083 A1 | 12/2007 | Kamata | |
| 2008/0164880 A1 | 7/2008 | Jaeger et al. | |
| 2008/0309317 A1* | 12/2008 | Chen et al. ...................... 324/72 |

FOREIGN PATENT DOCUMENTS

| | | |
|---|---|---|
| WO | WO 2008/108979 A1 | 9/2008 |
| WO | WO 2010/032995 A2 | 3/2010 |

OTHER PUBLICATIONS

European Search Report of EP 10 19 2609 dated Jul. 11, 2011.

* cited by examiner

*Primary Examiner* — Patrick Ryan
*Assistant Examiner* — Ben Lewis
(74) *Attorney, Agent, or Firm* — Sughrue Mion, PLLC (57) ABSTRACT

The present invention concerns an electrochemical system (100) including a stack of series connected electrochemical units (102). The system is controlled by a control circuit (104) and includes a plurality of differential amplifiers (114), each connected by two inputs to the terminals of an electrochemical unit, in order to supply a voltage representative of the potential difference present between the terminals of said electrochemical unit. Each representative voltage is sent to a control unit (106) arranged for converting said representative voltage into a numerical value transmitted to the control circuit. The system further includes, between each differential amplifier and the control unit, a buffer means (116) controlled by the control circuit. The buffer means is capable of saving the voltage representative of the potential difference present between the terminals of the electrochemical unit to which it is connected. The voltage is saved simultaneously by all of the buffer means.

19 Claims, 4 Drawing Sheets

MEASURING SYSTEM FOR CELLS IN A FUEL CELL STACK

This application claims priority from European Patent Application No. 10192609.5 filed Nov. 25, 2010, the entire disclosure of which is incorporated herein by reference.

The present invention concerns an electrochemical system. This system includes a stack of electrochemical units connected in series. The system is controlled by a control circuit and includes a plurality of differential amplifiers, each connected by two inputs to the terminals of an electrochemical unit, in order to supply a voltage representative of the potential difference present between the terminals of said electrochemical unit. Each representative voltage is sent to a control unit arranged for converting said representative voltage into a numerical value transmitted to the control circuit.

BACKGROUND OF THE INVENTION

Assemblies of electrochemical units connected in series (often called stacks) are known. The electrochemical units thus assembled may be formed for example by accumulator elements, or by fuel cells. A fuel cell is an electrochemical device for converting chemical energy directly into electrical energy. For example, one type of fuel cell includes an anode and a cathode between which a proton exchange membrane is arranged, often called a polymer electrolyte membrane. This type of membrane only allows protons to pass between the anode and the cathode of the fuel cell. At the anode, diatomic hydrogen undergoes a reaction to produce $H^+$ ions which will pass through the polymer electrolyte membrane. The electrons generated by this reaction join the cathode by a circuit external to the fuel cell, thus generating an electric current.

Because a single fuel cell generally only produces a low voltage (around 1 Volt), fuel cells are often connected in series to form fuel cell stacks able to generate a higher voltage comprising the sum of the voltages of each cell. One drawback of fuel cell stacks is that disconnecting them is not sufficient to stop them. Indeed, if the current supplied at output by a fuel cell is suddenly reduced to zero, the fuel cells which form the stack are no longer able to eliminate the electrochemical energy they are producing, and the voltage at the terminals of the different cells is liable to rise to the point that it accelerates degradation of the polymer membrane and the catalysts associated therewith. It is not sufficient either to interrupt the supply of fuel and oxidant to stop a fuel cell stack. In this case, the quantity of fuel and oxidant enclosed within the stack is sufficient to maintain the reaction for a considerable period of time. In the case of a fuel cell stack that uses hydrogen as fuel and oxygen as oxidant, it may even take several hours for the stack to stop.

It is therefore advantageous to provide systems having electrochemical units, such as fuel cell stacks, with measuring devices for monitoring the voltage produced by each cell, so as to detect any variation when the system of electrochemical units is in constant operation or when it is in a stop phase.

There are known asynchronous measuring devices which take two forms.

Figure 1:
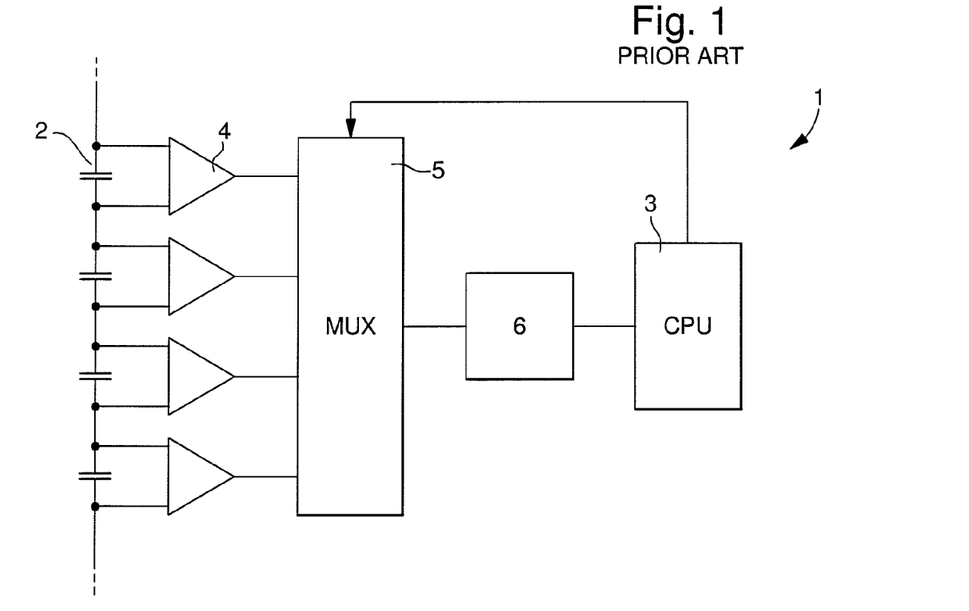
FIGS. 1 and 2 show schematically the electrochemical system of the prior art.

In the first form illustrated in FIG. 1, electrochemical unit system 1 includes a plurality of differential amplifiers 4 each connected by two inputs to the terminals of an electrochemical unit 2, so as to supply a voltage representative of the potential difference between the terminals of said electrochemical unit 2. These differential amplifiers 4 are connected, at output, to a multiplexer 5, the output of which is connected to an analogue-digital converter 6. Multiplexer 5 is then operated to select each differential amplifier 4 in sequence, so that the voltage representative of the potential difference present between the terminals of said electrochemical unit 2 to which it is connected, can be sent to analogue-digital converter 6. This converter then digitizes said voltage and sends it to a processor or CPU 3, which recovers all of the digitized representative voltages in order, subsequently, to interpret them.

Figure 2:
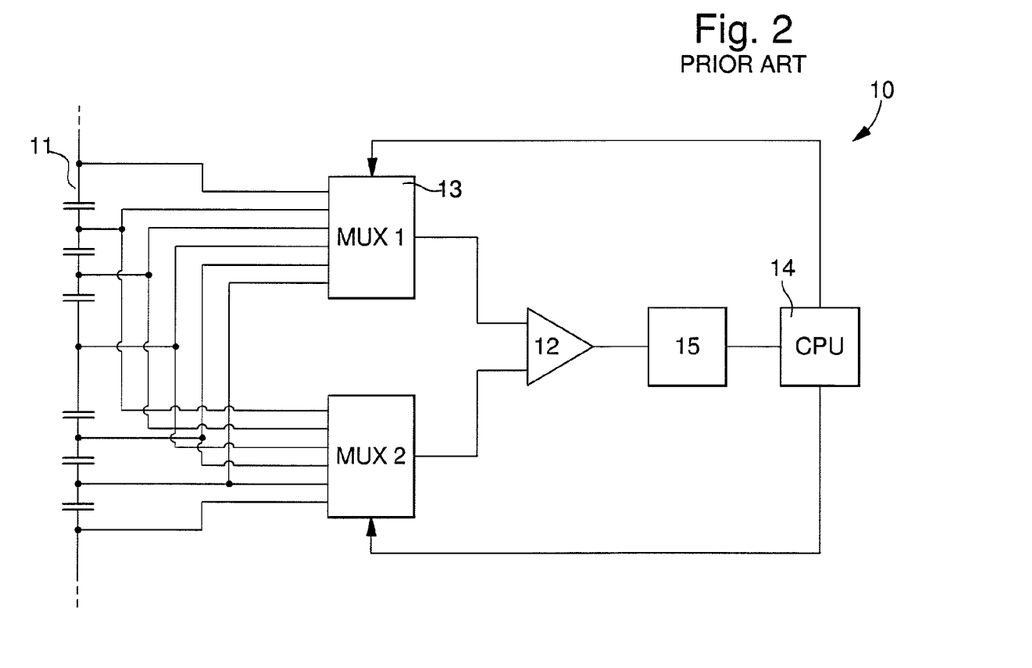

In the second form, illustrated in FIG. 2, electrochemical unit system 10 includes a first MUX1 and a second MUX2 multiplexer 13, wherein the positive terminal of each unit 11 is connected to the input of the first multiplexer 13 and the negative terminal of each unit 11 is connected to the input of the second multiplexer. The output of each multiplexer 13 is connected to an input of a differential amplifier 12. The voltage representative of the potential difference between the terminals of an electrochemical unit 11 is measured by selecting, via the first and second multiplexers 13, the potentials that correspond to said electrochemical unit 11. These potentials are sent to differential amplifier 12 in order to supply said voltage representative of the potential difference. The measurement of the voltage representative of the potential difference between the terminals of the next electrochemical unit 11 is then sent to an analogue-digital converter 15. The latter then digitizes said voltage and sends it to a processor or CPU 14, which recovers all of the digitized representative voltages in order, subsequently, to interpret this data.

The drawback of these two forms is that they are asynchronous. In fact, the process used in these two forms performs the measurements one after the other. Consequently, in the case of a stack of electrochemical units that includes around a hundred electrochemical units, the voltage of the hundred electrochemical units has to be measured in order to obtain the voltage representative of all the electrochemical units in the stack. Consequently, before the voltage of the first electrochemical unit can be measured again, the representative voltage has to be measured for all the electrochemical units. The time interval between two representative voltage measurements of the same electrochemical unit is thus too long.

Moreover, this method leads to a time lag between two voltage measurements of two contiguous electrochemical units. This means that it is not possible, at any determined time, to have the state of all of the electrochemical units, since the representative voltage of two contiguous electrochemical units has not been measured when the electrochemical units are in the same state, because a time lag has appeared. There therefore exists a risk that a voltage variation in one of the electrochemical units will not be detected and will cause damage to the system of electrochemical units. And even when a problem is detected, there is no way to tell which electrochemical unit is defective, since the voltage at the terminals of the units can vary according to operating conditions.

SUMMARY OF THE INVENTION

It is an object of the present invention to provide an electrochemical system including a stack of electrochemical units, wherein the measurements of a voltage representative of the potential difference present between the terminals of the electrochemical units are reliable and instantaneous and enable any problem with one or several units to be simply and efficiently detected.

The invention therefore concerns an electrochemical system, characterized in that, between each differential amplifier and the control unit, it includes a buffer means controlled by the control circuit, the buffer means being capable of saving the voltage representative of the potential difference between the terminals of the electrochemical unit to which it is connected, and in that the voltage is saved simultaneously by all of the buffer means.

One advantage of the present invention is that the voltage of each unit can be measured simultaneously, so as to obtain, at a precise time, the voltages of all of the electrochemical units. After having recovered, at various times, the image of the voltage of all the electrochemical units, the user can then compare these representative images of the stack of electrochemical units. He can then easily detect a problem due to a voltage variation in one or several electrochemical units, and also easily detect the defective electrochemical unit or units.

Advantageous embodiments of the electrochemical system of the present invention form the subject of the dependent claims.

In a first, advantageous embodiment, each buffer means includes first switching means and second switching means arranged in series between the amplifier to which the buffer means is connected and the control unit, each buffer means further including a capacitor, the input of which is connected to the connection point between the first and second switching means and thus the output is connected to a reference point.

In a second, advantageous embodiment, all the second switching means are grouped together in the form of a multiplexer, each input of which is connected to the first switching means of a buffer means, the multiplexer output being connected to an input of the control unit.

In a third, advantageous embodiment, said stack of electrochemical units is subdivided into different groups including several electrochemical units, each associated with a differential amplifier and a buffer means, and a control unit connected to the output of the buffer means associated with each electrochemical unit of the group, and each group has its own reference voltage. In fact, the division of electrochemical units into groups of several electrochemical units limits the potential difference between the units of the same series. Moreover, since each group has its own reference voltage, the potential difference between the various units of the same series and the reference voltage of the control group associated with that series can be kept within a range compatible with ordinary semiconductor devices.

In another advantageous embodiment, the voltage reference of each group is taken across one of the terminals of one electrochemical unit belonging to said group.

In another advantageous embodiment, the second switching means of the units belonging to the same group are grouped together in the form of a multiplexer, each input of which is connected to the first switching means of a buffer means, and the multiplexer output is connected to an input of the control unit of said group.

In another advantageous embodiment, the control unit of each group is connected to the control circuit via communications means.

In another advantageous embodiment, the first switching means of each buffer means takes the form of a transistor controlled by a control signal.

In another advantageous embodiment, the second switching means of each buffer means takes the form of a transistor controlled by a control signal.

In another advantageous embodiment, the control signal of each transistor is sent by the control circuit.

In another advantageous embodiment, the control signal of each transistor is sent by the control unit.

In another advantageous embodiment, the control unit includes at least one analogue-digital conversion means, arranged for digitizing the value of the voltage representative of the potential difference present between the terminals of each electrochemical unit.

In another advantageous embodiment, the number of analogue-digital conversion means included in the control unit is equal to the number of buffer means, and each buffer means is connected to an analogue-digital conversion means.

In another advantageous embodiment, the control unit of each group includes at least one analogue-digital conversion means arranged for digitizing the value of the voltage representative of the potential difference present between the terminals of each electrochemical unit of said group.

In another advantageous embodiment, the number of analogue-digital control means included in the control unit of each group is equal to the number of buffer means of said group, and each buffer means is connected to an analogue-digital conversion means.

Moreover, this division of electrochemical units into several series, each associated with a control unit, means that quicker data processing can be envisaged. It is possible to arrange the analogue-digital conversions in parallel. This means that each group of electrochemical units digitizes, at the same time, the voltages representative of the potential difference between the terminals of each electrochemical unit of said group. This thus saves time and therefore a higher measurement frequency can be envisaged, offering improved monitoring.

The invention also concerns a method for managing the aforecited electrochemical system. This system further includes, between each differential amplifier and the control unit, a buffer means controlled by the control circuit, wherein said buffer means includes a capacitor, connected at the input thereof to the output of the differential amplifier, by a first switching means and to the control unit by a second switching means, and at the output thereof, to the system earth. The system operates in a first operating mode, called the normal mode, in which the first and second switching means are open and a second operating mode, called the measuring mode, in which the following steps are performed:

the first switching means of each electrochemical unit are simultaneously closed; and the voltage representative of the potential difference present between the terminals of the electrochemical unit to which said capacitor is connected is saved in each capacitor; and the first switching means of each electrochemical unit are simultaneously opened; and the values of the voltage representative of the potential difference between the terminals of each electrochemical unit are processed by transmission to the control unit, by action on the second switching means of each buffer means.

In an advantageous embodiment, the step of processing the values of the voltage representative of the potential difference present between the terminals of each electrochemical unit consists in sequentially closing the second switching means of each buffer means, so as to transfer the value saved in each capacitor to the control unit.

In another advantageous embodiment, said stack of electrochemical units is subdivided into different groups including several electrochemical units, each associated with a differential amplifier and a buffer means, and a control unit connected to the output of the buffer means, wherein each group has its own voltage reference and the steps of the second operating mode are performed sequentially for each group.

In another advantageous embodiment, the steps of the second operating mode are performed simultaneously for each group.

BRIEF DESCRIPTION OF THE DRAWINGS

The objects, advantages and features of the electrochemical system according to the present invention will appear more clearly in the following detailed description of at least one embodiment of the invention, given solely by way of non-limiting example and illustrated by the annexed drawings, in which.

DETAILED DESCRIPTION OF THE INVENTION

In the following description, all those parts of the fuel cell stack that are well known to those skilled in this technical field will be described only in a simplified manner.

Figures 3, 4:
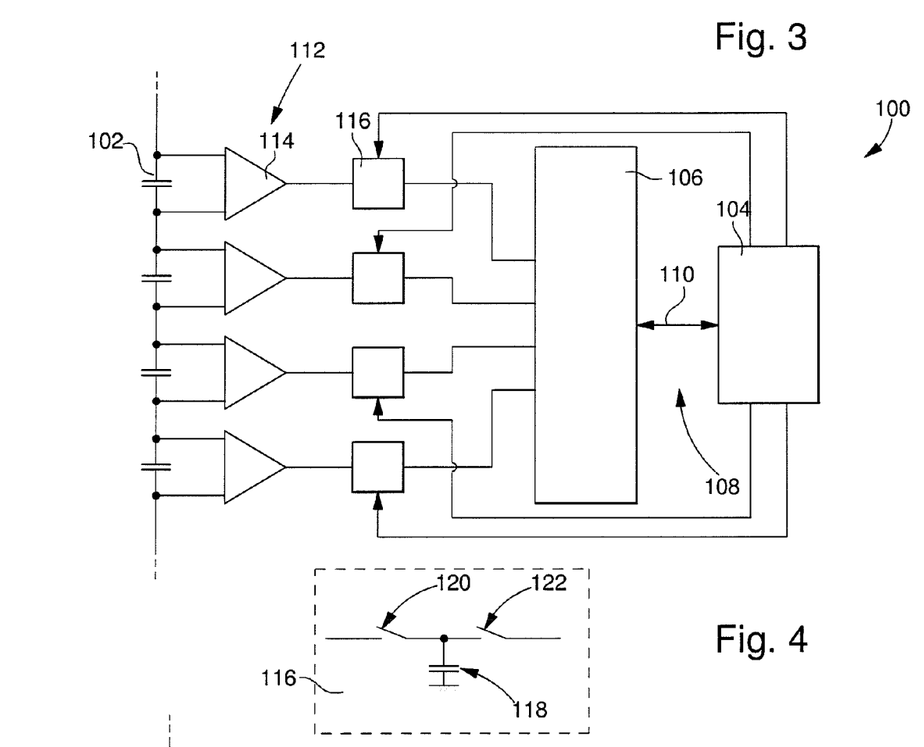
FIG. 3 is a schematic view of the electrochemical system according to a first embodiment of the present invention.
FIGS. 4 and 5 show schematic views of the buffer means of the system according to the present invention.

FIG. 3 shows a schematic view of an electrochemical system 100 according to the present invention, associated with a fuel cell stack. This stack includes a multitude of electrochemical units 102 each having a negative pole and a positive pole, used as connection points. In this example, each unit 102 may be formed of a single fuel cell 102 or of several contiguous fuel cells. However, for the sake of simplicity, the following description will refer indiscriminately to electrochemical unit 102 or to cell 102, although is possible for one electrochemical unit 102 to be in fact formed of two or more cells 102. Electrochemical units 102 are series connected to form what is commonly called a fuel cell stack. Each cell 102 supplies a voltage, the value of which reaches approximately 1.2 Volts, which, for an example of around forty series connected cells, gives a total voltage of around 48 Volts. The entire system is controlled by a control circuit 104.

In a first embodiment, the system includes a control unit 106 provided for communicating with a control circuit 104, said control unit 106 taking the form of a microprocessor. Control unit 106 is powered by the power supply of electrochemical system 100. It communicates with control circuit 104 via a means or system of communication 108. This communication means 108 allows the central control circuit 104 to send instructions to control unit 106. It also enables control unit 106 to send control circuit 104 information as to the state of the electrochemical cells 102. Communication means 108 may be a bus 110 taking the form of a set of parallel electric wires. The bus 110 used may use the SPI protocol including 3 distinct wires or any other protocol, such as for example the I²C protocol.

Electrochemical system 100 also includes measuring circuits 112 which are each formed by a differential amplifier 114, associated with an electrochemical unit 102, as shown in FIG. 3. These differential amplifiers 114 operate with voltages supplied by the power supply of the system. Differential amplifiers 114 have two inputs respectively connected to the positive pole and to the negative pole of the various units 102. Differential amplifiers 114 are arranged to form subtracter circuits allowing them to measure the potential difference between the cathode and the anode of an electrochemical unit 102. In this example, each electrochemical unit 102 includes a differential amplifier 114.

According to the invention, the output of each differential amplifier 114 is connected to the control unit 106 via a buffer means 116. This buffer means 116, shown in FIG. 4, includes a capacitor 118 and first 120 and second 122 switching means. These first 120 and second 122 switching means are series connected such that the output of the first switching means 120 is connected to the input of the second switching means 122. The input of the first switching means 120 is connected to the output of said differential amplifier 114 and the output of the second switching means 122 is connected to an input of control unit 106. The input of capacitor 118 is connected to the connection point between the first 120 and second 122 switching means. The output of capacitor 118 is connected to the electrochemical system 100 earth. Buffer means 116 is then T-shaped.

Figure 5:
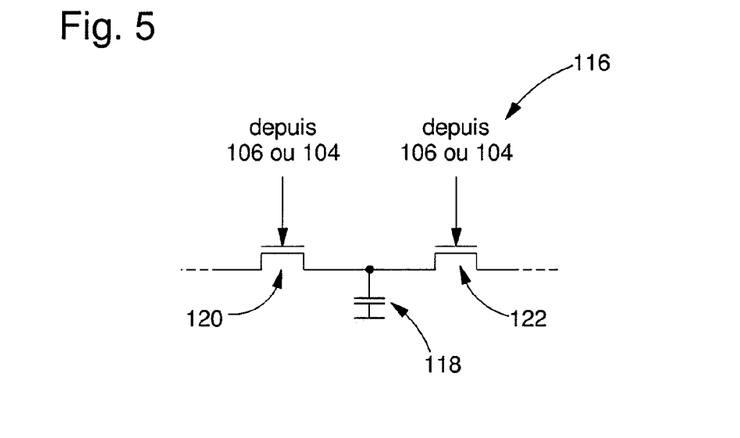

The first 120 and second 122 switching means are controllable, via a control signal, by the central control circuit 104 or by control unit 106. These first 120 and second 122 switching means take the form of controlled switches. Advantageously, transistors are used to fulfil this function. These transistors may be P or N, bipolar or FET transistors, as seen in FIG. 5.

The purpose of this buffer means 116 is to enable the voltage representative of the potential difference of each unit 102 to be measured simultaneously, so as to obtain, at a given time, the state of all of electrochemical units 102 of electrochemical system 100.

Electrochemical system 100 operates in two operating modes. A first, normal, operating mode is the operating mode in which the multitude of electrochemical units 102 of the fuel cell stack delivers a voltage. In this first operating mode, the first 120 and second 122 switching means are open and thus no electrical connection is formed between the differential amplifiers 114, buffer means 116 and control unit 106.

A second, "measuring", operating mode is the operating mode in which the voltage representative of the potential difference at the terminals of electrochemical unit 102 is measured to allow the operation of said electrochemical system 100 to be monitored. In this operating mode, a first step consists in closing the first switching means 120 of each buffer means 116. Control unit 106 or, preferably, control circuit 104 controls this closing operation. This closing command is sent, via a control signal, simultaneously to all of the first switching means 120 of buffer means 116. This allows an electrical connection between the differential amplifier 114 and the capacitor 118, for each buffer means 116, and thus enables all the voltages representative of the potential difference present between the terminals of each electrochemical unit 102 to be stored at the same time.

Once these measurements have been saved in capacitors 118 of buffer means 116, a second step consists in opening all of the first switching means 120 of buffer means 116, via a control signal which commands the opening, so as to isolate capacitors 118 and consequently to preserve said measurements. Control unit 106, or preferably control circuit 104, commands this opening.

A third step consists in processing these voltage measurements, so as to convert them into a numerical value that can be used by control circuit 104. To achieve this, control unit 106 is arranged to perform analogue-digital conversions and includes at least one analogue-digital conversion means (not shown) to perform said analogue-digital conversions. This analogue-digital conversion means is, for example, a conventional analogue-digital converter. The output of all of the second switching means 122 is connected to a common input of control unit 106. This arrangement thus allows sequential digitization of the measurements saved in capacitors 118. This sequential digitization is performed by closing in succession the second switching means 122 of each buffer means 116. Control unit 106 or, preferably, control circuit 104 controls this closing operation. The saved voltage is then transmitted to control unit 106 which receives and digitizes this data. Once digitized, this data is stored in a memory (not shown) comprised in control unit 106 or sent directly to control circuit 104 via communication means 108. The second switching means 122 of buffer means 116 of the first electrochemical unit 102 is then opened and it is the turn of the second switching means 122 of buffer means 116 of the next electrochemical unit 102 to be closed to allow the digitization of the voltage saved in the associated capacitor 118 and so on.

This sequential digitization is not a drawback, since the main object of the present invention to obtain, at the same moment, all the voltages representative of the potential difference between the terminals of each electrochemical unit 102 and not to obtain these measurements as quickly as possible.

Figure 6:
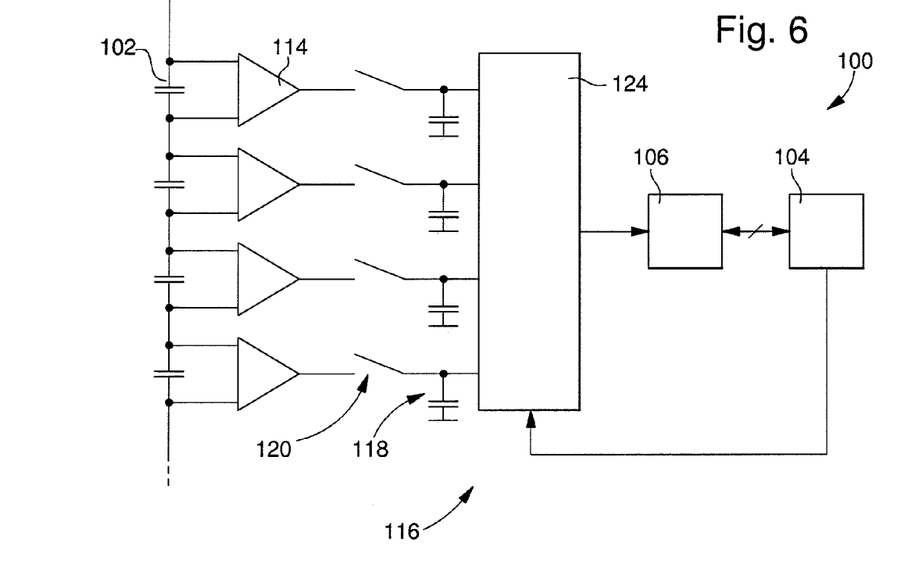
FIG. 6 shows a schematic view of a variant of the electrochemical system according to the first embodiment of the present invention.

In a variant shown in FIG. 6, all of the second switching means 122 of buffer means 116 are replaced by a multiplexer 124, which has a number of inputs equal to the number of differential amplifiers 114. Each input of this multiplexer 124 is connected to the output of the first switching means 120 of a buffer means 116. The multiplexer 124 is operated by control unit 106 or by control circuit 104 to select in succession the capacitor 118 which will be connected to control unit 114.

Control circuit 104 thus obtains series of voltages representing the state of all of electrochemical units 102 at the same moment. Something similar to an image of the state of electrochemical units 102 is thus obtained. Since this process is carried out regularly, it becomes easy to identify a problem. Indeed, by comparing the images reflecting the state of electrochemical units 102, it is easy to detect a failure in electrochemical system 100. Further, it becomes extremely easy to detect the electrochemical unit or units 102 which are defective, simply by comparing the various images reflecting the state of electrochemical units 102. Since the operation of the electrochemical units is supposed to change at the same time and it is possible to have the image reflecting the state of electrochemical units 102 at a given moment, a comparison of the images shows whether one electrochemical unit 102 is changing differently from the others.

Advantageously, it is possible to shorten the measurement-digitization cycle by providing the control unit 106 with a number of analogue-digital conversion means equal to the number of electrochemical units 102. This then enables all of the voltage measurements to be digitized simultaneously, since all of the second switching means 122 are closed at the same time. This variant is advantageous in the case of an electrochemical system 100 which has a large number of electrochemical units 102.

Figure 7:
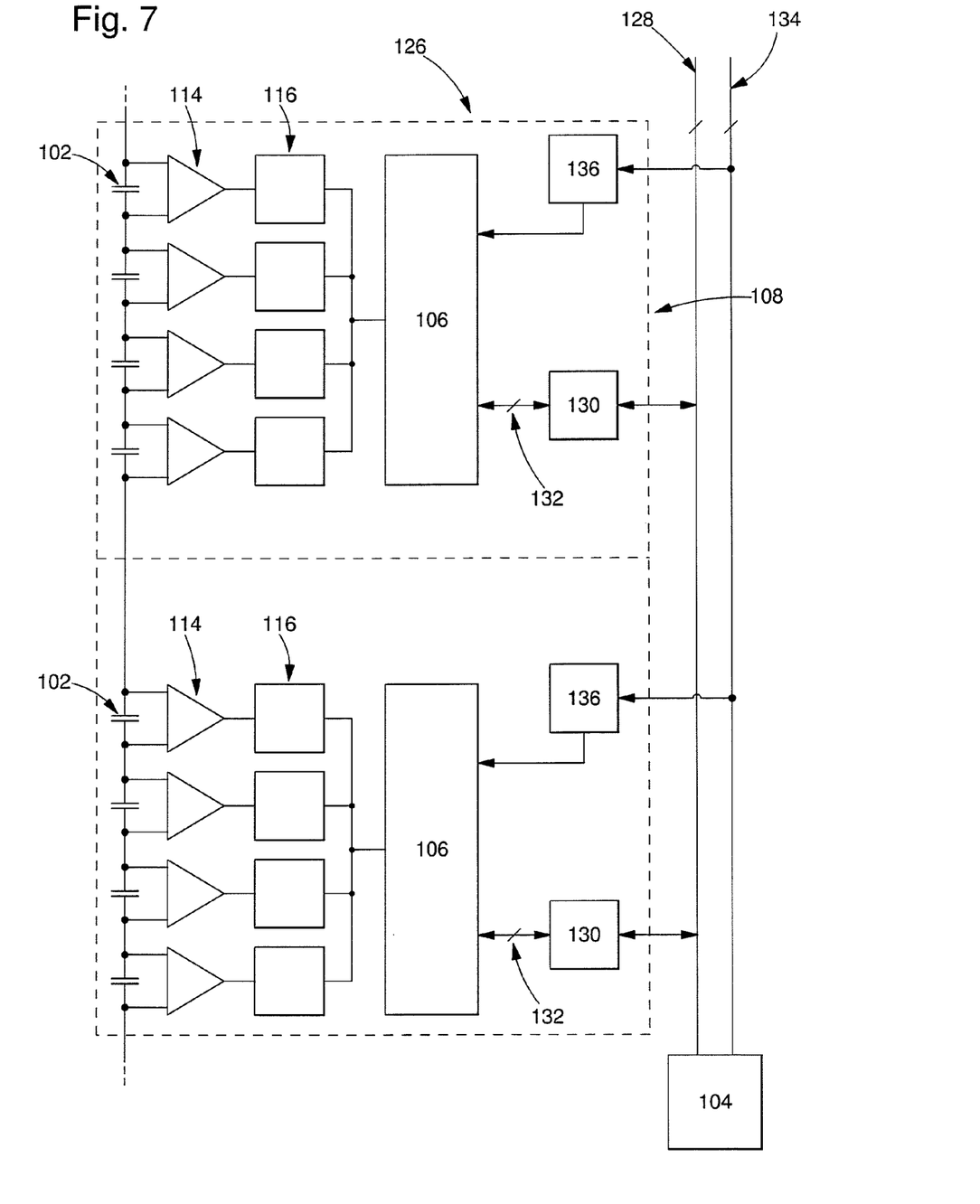
FIG. 7 is a schematic view of the electrochemical system according to a second embodiment of the present invention.

In a second embodiment shown in FIG. 7, the electrochemical units 102 are grouped together in groups or series 126, including several electrochemical units 102. Each group 112 preferably includes the same number of electrochemical units 102, and in this example each group 126 has four electrochemical units 102. Each group 126 thus includes a control unit 106, provided for communicating with control circuit 104 which manages all of the groups 126 via switching means 108. This means 108 includes an optocoupler 130 for isolating said group 126. This optocoupler 130 is connected to control unit 106 by an internal bus 132 and to control circuit 104 by a transfer bus 128. Each electrochemical unit 102 of the group is connected to control unit 106 of the group by a differential amplifier 114 and a buffer means 116. Each group 126 is powered by a power bus 134. This power bus 134 consists of a distinct power circuit, which is not dependent on the voltage supplied by electrochemical system 100. This enables groups 126 to operate even if the fuel cell stack is powered off.

Each group 126 includes its own electric power supply 136, which receives its energy from power bus 134, but is galvanically separate therefrom. Owing to this feature, each group 126 can have its own reference voltage. In this example, galvanic isolation is ensured by an isolation transformer, the primary of which is connected to power bus 134 and the secondary of which forms part of power supply 134. In this example, power supply 136 supplies the elements of group 126 with a positive voltage +2.5V and a negative voltage −2.5V relative to the reference voltage of group 126. Those skilled in the art will understand that instead of being coupled inductively to power bus 134, power supply 136 could alternatively be capacitively coupled to power bus 134.

Each group 126 is thus made independent by the fact that it has its own voltage reference. For this purpose, the earth of each group 126 is connected to one of the connection terminals of one of electrochemical units 102 belonging to said group 126. It will be clear that, owing to this feature, the potential difference between the inputs of a differential amplifier 114 and the earth thereof does not exceed a few volts.

Preferably, the connection point used as reference is taken in the middle of the series of electrochemical units 102 forming group 126. In the example, where groups 126 include four electrochemical units 102, the reference voltage is thus taken between the second and third electrochemical unit 102. It is also clear that the maximum number of electrochemical units 102 per group 126 depends upon the maximum potential difference tolerated by a differential amplifier 114 between earth and one of the inputs thereof. Thus, in the case where the maximum tolerated potential difference between a cell potential and the reference voltage of group 126 is 8V, and where each electrochemical unit 102 produces a maximum of 1.2V, the maximum number of electrochemical units 102 per group 126 is 12 (6×1.2V).=7.2V.; 7.2V.<8V.).

The operation is identical to that of the first embodiment, i.e., there is a first, normal, operating mode, which is the operating mode in which the multitude of electrochemical units 102 of the fuel cell stack delivers a voltage, and a second "measuring" operating mode, which is the operating mode in which the voltage representative of the potential difference at the terminals of each electrochemical unit 102 is measured, by simultaneously closing all the first switching means 120, in order to be analysed, so as to monitor the operation of said fuel cell stack. The measuring and digitizing operations are identical to those described in the first embodiment. The closing and opening operations of the first 120 and second 122 switching means are controlled by control circuit 104, or preferably by control unit 106 of each group 126. The first switching means 120 may also be controlled by control circuit 104, while the second switching means 122 of the buffer means 116 of each group are controlled by control unit 106 of said group 126.

The values of the voltages representative of the potential difference at the terminals of the electrochemical units 102 of the various groups 126 are digitized sequentially and by group 126. Control unit 106 of the first group 126 digitizes, via at least one analogue-digital conversion means, the voltage values representative of the potential difference at the terminals of the electrochemical units 102 of its group 126, using the method described hereinabove. Once this digitization has finished, the digitized values are sent to control circuit 104 via the internal bus 132, optocoupler 130 and transfer bus 128. The message including this digitized data also includes a specific marker for the group from which the data is derived. This enables the following groups 126 to detect the advance of digitization. Hence, each group 126 can automatically start the digitization of this data as soon as the digitization of the preceding group 126 has finished and so on.

In a first variant of this second embodiment, the digitization is performed in parallel. To achieve this, the control units 106 of the various groups 126 digitize, at the same time, the voltage values representative of the potential difference at the terminals of the electrochemical units 102, with which they are associated. For example, take the case of a system having ten groups 126 each having one control unit 106 and four electrochemical units 102. All of the measurements are thus digitized ten times more quickly than for sequential digitization. The data is, however, always sent sequentially.

Nonetheless, in a second variant, digitization is performed even more quickly. To achieve this, the number of analogue-digital conversion means in each control unit 106 is equal to the number of electrochemical units 102 in the group 126. Consequently, all the measurements of voltages representative of the potential difference at the terminals of the electrochemical units 102 are digitized simultaneously.

Figure 8:
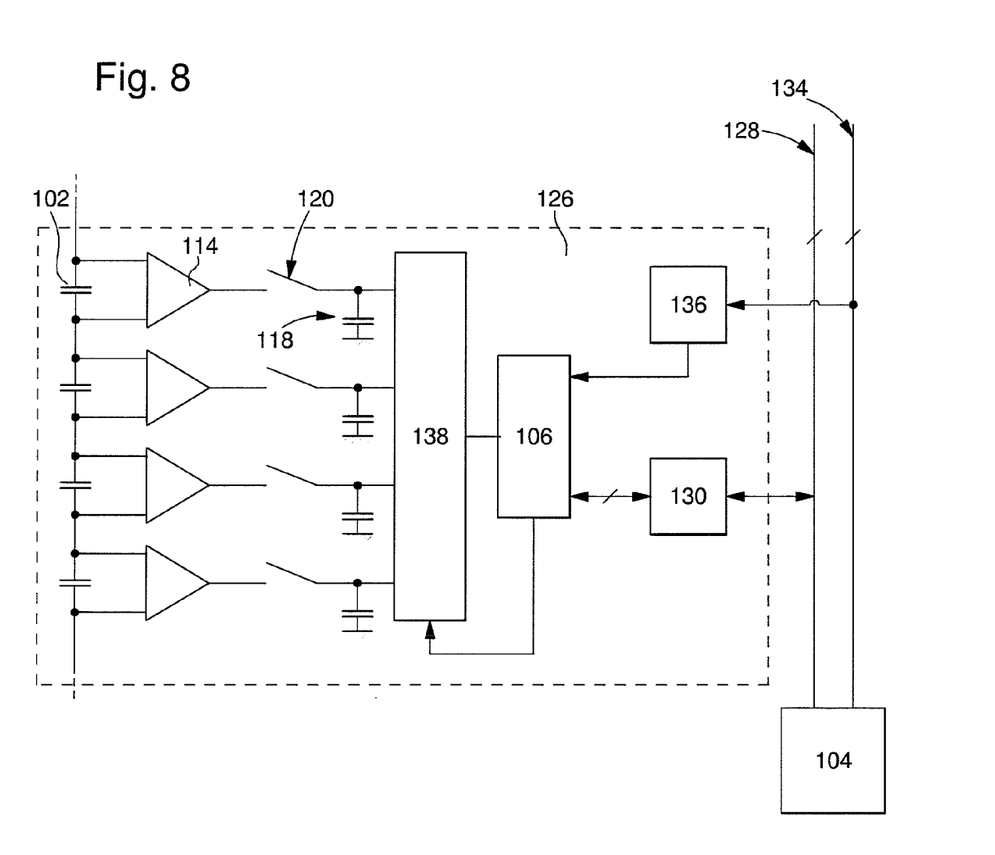
FIG. 8 shows a schematic view of a variant of the electrochemical system according to the second embodiment of the present invention.

In this second embodiment, as shown in FIG. 8, the second switching means 122 of buffer means 116 of each group 126 may be replaced by a multiplexer 138 having a number of inputs equal to the number of differential amplifiers 114 of said group 112. Each input of this multiplexer 138 is connected to the output of the first switching means 120 of a buffer means 116. This multiplexer 138 is preferably controlled by control unit 116 of group 126. It thus simplifies the system 100 by having fewer connections and electrical paths than when second switching means 122 takes the forms of transistors which are opened and closed by a voltage.

It will be clear that various alterations and/or improvements and/or combinations evident to those skilled in the art may be made to the various embodiments of the invention set out above without departing from the scope of the invention defined by the annexed claims. For example, the measuring system according to the present invention may be applied to an accumulator battery system including a multitude of electrochemical cells.

What is claimed is:

1. An electrochemical system including a stack of electrochemical units connected in series, wherein the system is controlled by a control circuit and includes a plurality of differential amplifiers, each connected by two inputs to the terminals of an electrochemical unit, so as to supply a voltage representative of the potential difference between the terminals of said electrochemical unit, each representative voltage is sent to a control unit arranged for converting said representative voltage into a numerical value transmitted to the control circuit, wherein the system further includes, between each differential amplifier and the control unit, a buffer means controlled by the control circuit, the buffer means being capable of saving the voltage representative of the potential difference present between the terminals of the electrochemical unit connected thereto, and wherein the voltage is saved simultaneously by all of the buffer means, wherein each buffer means includes first switching means and second switching means series connected between the amplifier to which the buffer means is connected and the control unit, wherein each buffer means further includes a capacitor, the input of which is connected to the point of connection between the first and second switching means, and thus the output is connected to a reference point, and wherein all of the second switching means are grouped together in the form of a multiplexer, each input of which is connected to the first switching means of a buffer means, the output of the multiplexer being connected to an input of the control unit.

2. The electrochemical system according to claim 1, wherein said stack of electrochemical units is subdivided into different groups including several electrochemical units, each associated with a differential amplifier and a buffer means, and a control unit connected to the output of the buffer means associated with each electrochemical unit of the group, and wherein each group has its own voltage reference.

3. The electrochemical system according to claim 2, wherein the voltage reference of each group is taken across one of the terminals of an electrochemical unit belonging to said group.

4. The electrochemical system according to claim 3, wherein the control unit of each group includes at least one analogue-digital conversion means, arranged for digitizing the value of the voltage representative of the potential difference present between the terminals of each electrochemical unit of said group.

5. The electrochemical system according to claim 4, wherein the number of analogue-digital conversion means included in the control unit of each group is equal to the number of buffer means of said group, and each buffer means is connected to an analogue-digital conversion means.

6. The electrochemical system according to claim 2, wherein the second switching means of the units belonging to the same group are grouped together in the form of a multiplexer, each input of which is connected to the first switching means of a buffer means, and the output of the multiplexer is connected to an input of the control unit of said group.

7. The electrochemical system according to claim 2, wherein the control unit of each group is connected to the control circuit via switching means.

8. The electrochemical system according to claim 2, wherein the control unit of each group includes at least one analogue-digital conversion means, arranged for digitizing the value of the voltage representative of the potential difference present between the terminals of each electrochemical unit of said group.

9. The electrochemical system according to claim 8, wherein the number of analogue-digital conversion means included in the control unit of each group is equal to the number of buffer means of said group, and each buffer means is connected to an analogue-digital conversion means.

10. The electrochemical system according to claim 1, wherein the first switching means of each buffer means takes the form of a transistor controlled by a control signal.

11. The electrochemical system according to claim 1, wherein the second switching means of each buffer means takes the form of a transistor controlled by a control signal.

12. The electrochemical system according to claim 1, wherein the control unit includes at least one analogue-digital conversion means, arranged for digitizing the value of the voltage representative of the potential difference present between the terminals of each electrochemical unit.

13. The electrochemical system according to claim 12, wherein the number of analogue-digital conversion means included in the control unit is equal to the number of buffer means, and each buffer means is connected to an analogue-digital conversion means.

14. The electrochemical system according to claim 1, wherein the control unit of each group includes at least one analogue-digital conversion means, arranged for digitizing the value of the voltage representative of the potential difference present between the terminals of each electrochemical unit of said group.

15. The electrochemical system according to claim 14, wherein the number of analogue-digital conversion means included in the control unit of each group is equal to the number of buffer means of said group, and each buffer means is connected to an analogue-digital conversion means.

16. The method for managing an electrochemical system including a stack of electrochemical units connected in series, wherein the system is controlled by a control circuit and includes a plurality of differential amplifiers, each connected by two inputs to the terminals of an electrochemical unit, so as to supply a voltage representative of the potential difference between the terminals of said electrochemical unit, each representative voltage is sent to a control unit, arranged for converting said representative voltage into a numerical value transmitted to the control circuit, wherein the system further includes, between each differential amplifier and the control unit, a buffer means controlled by the control circuit, said buffer including a capacitor connected, at the input thereof, to the output of the differential amplifier by a first switching means and to the control unit by a second switching means, and at the output thereof, to the system earth, wherein said system operates in a first, normal, operating mode, in which the first and second switching means are open and a second, measuring, operating mode, in which the following steps are performed:
  the first switching means of each electrochemical unit are simultaneously closed;
  the voltage representative of the potential difference present between the terminals of the electrochemical unit, to which said capacitor is connected, is saved in each capacitor;
  the first switching means of each electrochemical unit are simultaneously opened; and
  the values of the voltage representative of the potential difference between the terminals of each electrochemical unit are processed by transmission to the control unit, via action on the second switching means of each buffer means.

17. The method according to claim 16, wherein the step of processing the values of the voltage representative of the potential difference present between the terminals of each electrochemical unit consists in sequentially closing the second switching means of each buffer means, so as to transfer the value saved in each capacitor to the control unit.

18. The method for managing an electrochemical system according to claim 16, wherein said stack of electrochemical units is subdivided into different groups including several electrochemical units, each associated with a differential amplifier and a buffer means, and a control unit, connected to the output of the buffer means, each group having its own voltage reference and in that the steps of the second operating mode are performed sequentially for each group.

19. The method for managing an electrochemical system according to claim 18, wherein the steps of the second operating mode are performed simultaneously for each group.

* * * * *